United States Patent [19]

Aguti et al.

[11] Patent Number: 4,797,584
[45] Date of Patent: Jan. 10, 1989

[54] POWER-ON RESET CIRCUIT FOR MOS LOGIC DEVICES

[75] Inventors: Alberto Aguti, Ponteranica; Maurizio Gaibotti, Barlassina; Vittorio Masina, Corporeno, all of Italy

[73] Assignee: SGS Microelettronica S.p.A., Catania, Italy

[21] Appl. No.: 14,490

[22] Filed: Feb. 13, 1987

[30] Foreign Application Priority Data

Feb. 18, 1986 [IT] Italy .................... 19441 A/86

[51] Int. Cl.$^4$ .................... H03K 5/13; H03K 17/16; H03K 19/20; H03K 3/01
[52] U.S. Cl. .................... 307/594; 307/443; 307/445; 307/448; 307/296 R; 307/597
[58] Field of Search ............... 307/443, 445, 448, 359, 307/296 A, 296 R, 594, 597

[56] References Cited

FOREIGN PATENT DOCUMENTS 0211027 6/1984 Fed. Rep. of Germany ...... 307/443

Primary Examiner—John S. Heyman
Assistant Examiner—Margaret R. Wanbach
Attorney, Agent, or Firm—Wolf, Greenfield & Sacks

[57] ABSTRACT

The power-on reset circuit is adapted to automatically provide a voltage pulse as a positive supply voltage is applied. It essentially comprises:

(a) a voltage divider adapted for supplying a reference voltage, comprised of a first and a second series arranged transistors of the normally conducting type, with one end coupled to ground and the opposite end coupled to the supply voltage;

(b) a bistable circuit comprised of a third and fourth transistors, of the normally non-conducting type (or enhancement type) having their respective gates and drains cross coupled, the drain of said first transistor being coupled to the connection point of the two transistors of said voltage divider through de-coupling means, and the drain of said fourth transistor being coupled on a side to said supply voltage through a fifth transistor which is normally coupled as a diode, and, on the other side, being coupled to the ground through resistance means; and (c) an end stage comprised of a normally locked sixth transistor having the source coupled to the ground and the gate coupled to the drain of said fourth transistor and a seventh transistor having the source coupled to the drain of said sixth transistor and the drain coupled to said supply voltage, its gate being coupled to the drain of said third transistor, the coupling point of said sixth and seventh transistors forming the output line supplying said reset pulse.

18 Claims, 2 Drawing Sheets

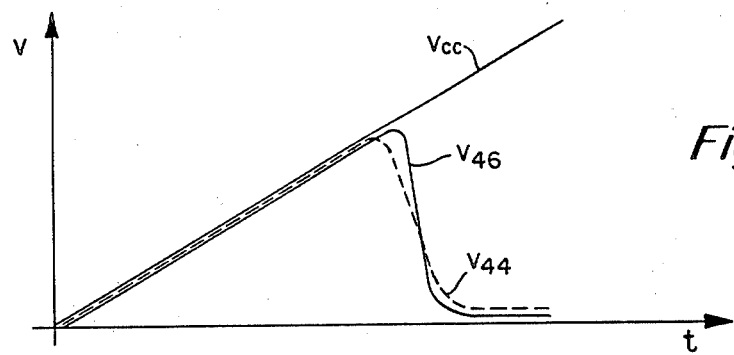
Fig. 4
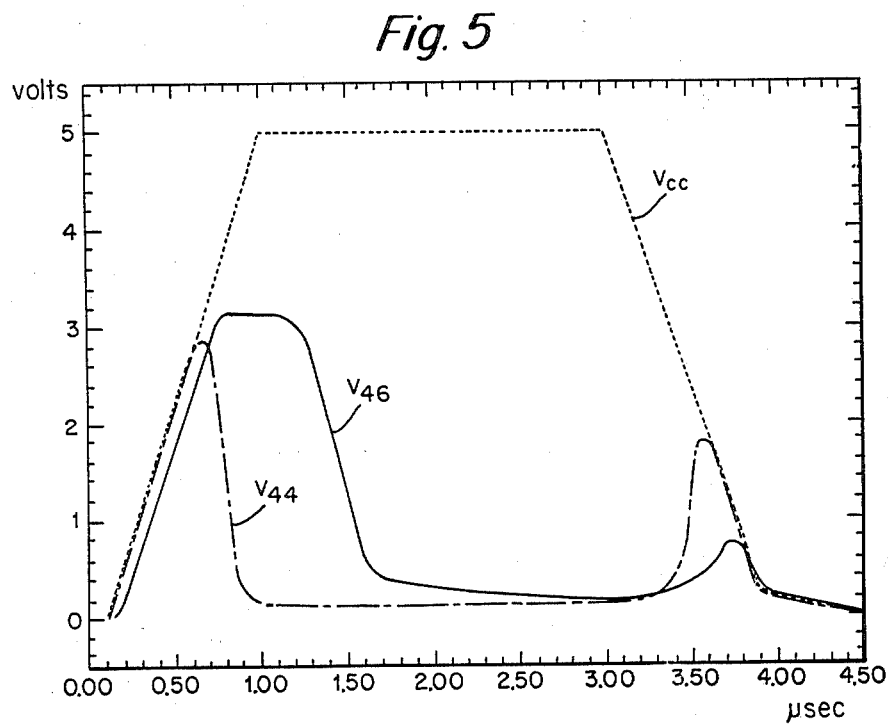

POWER-ON RESET CIRCUIT FOR MOS LOGIC DEVICES

BACKGROUND OF THE INVENTION

The present invention relates to a power-on reset circuit, for logic devices, particularly logic arrays associated with microprocessors and the like, in which the array is required to come up with its outputs and other internal circuits immediately reset to desired logic states. More specifically, the invention relates to such a circuit for application to MOS technology integrated devices.

In logic arrays, such as, typical peripheral units operating under the control of microprocessors, or in the microprocessors themselves, it is often required that, immediately as the power is switched on, any internal logic states not compatible with an immediate operation of the interface is removed.

In such circumstances it is necessary that the array is reset before the supply voltage applied to the logic array reaches a level such as to put the array in operation.

To this purpose, the array (typically an integrated circuit) is provided, as is known, with a reset pin, to which an outside circuit sends a suitable reset signal (usually a positive voltage pulse which, after carrying out its function, falals back to a low level).

SUMMARY OF THE INVENTION

The main object of the present invention is to provide a power-on reset circuit which may be directly integrated into a logic device in order to provide the above mentioned reset function, thereby dispensing with the complex outside circuitry required is the prior art as well as the reset pin included in the integrated circuit.

Another object is to provide such a circuit so that it operates automatically, immediately as the power is switched on, i.e. immediately as the supply voltage exceeds a pre-established threshold.

The above and other objects, as well as other objects and advantages which will become apparent hereinafter are achieved, according to the invention, by a power-on reset circuit for MOS technology logic networks, adapted for automatically supplying a reset pulse as a supply voltage is applied, particularly for peripheral units of microprocessors and the like, characterized in that it comprises:

(a) a voltage divider adapted for supplying a reference voltage, comprised of a first and second series-arranged transistors of the normally conducting type, with one end coupled to ground reference potential and the opposite end coupled to the supply voltage;

(b) a bistable circuit comprised of a third and fourth transistors of the normally non-conducting type having their respective gates and drains cross coupled, the drain of said third transistor being coupled to the coupling point of the two transistors of said voltage divider through de-coupling means and the drain of said fourth transistor being coupled, on one side, to said supply voltage through a fifth transistor which is normally coupled as a diode, and, on the other side, being coupled to the ground through resistance means; and (c) an end stage comprised of a normally locked sixth transistor having its source coupled to the ground and gate coupled to the drain of said fourth transistor, and a seventh transistor having its source coupled to the drain of said sixth transistor and its drain coupled to said supply voltage, its gate being coupled to the drain of said third transistor, the coupling point of said sixth and seventh transistors forming the output line supplying said reset voltage pulse.

Preferred embodiments of the invention will be disclosed hereinafter, by way of example, with reference to the accompanying drawings, wherein:

FIG. 4 is a qualitative diagram time of a few crucial voltages in the circuit of FIG. 3, with respect to time; and FIG. 5 is an exemplary diagram of the two reset voltages generated by a typical implementation of the circuit of FIG. 3, with respect to time.

In the circuit diagrams shown, wherein a P-type substrate (N-channel transistors) is assumed, the thick lines represent the implanted transistors, or depletion type transistors, and the thin lines represented the not implanted transistors or the enhancement type transistors. Small triangles indicate the ground reference points; however, it should be apparent that the ground reference voltage, which is assumed to be zero in the illustrated examples, may be any voltage which is more negative than the positive supply voltage $V_{cc}$. Finally, in the case of a P-channel implementation, all of the polarities and types of transistors should be reversed.

Figure 1:
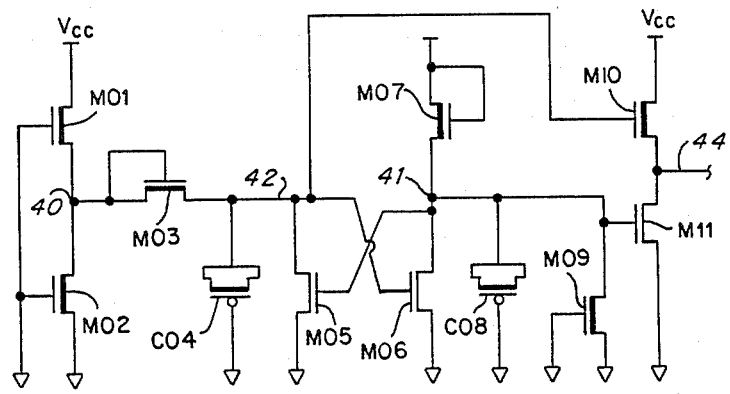
FIG. 1 is a circuit diagram of a first preferred embodiment of the invention.

With reference to FIG. 1, the first preferred embodiment of the invention comprises a power-on reset circuit made by the MOS-type integrated technology. In such a circuit, a reference voltage source comprises two implanted depletion transistors M01, M02, which are normally conducting, and which are, series-coupled to one another, with the source of M02 coupled to the ground, and the drain of M01 coupled to the positive supply voltage $V_{cc}$, typically of +5 V. Also the two gates of the transistors M01, M02 are connected to the ground. Accordingly, the two transistors M01, M02 together are equivalents to a consumption voltage divider, the output of which is the central junction point 40.

In the circuit according to the first embodiment there are further provided two non-implanted transistors M05, M06 (that is transistors of the enhancement type) which are normally non conducting, having their sources connected to ground, and with cross-connections between the gate of each and the drain of the other, so as to provide a bistable circuit, in which the conduction state of one of the transistors forces the other off and vice versa, as it will become apparent hereinafter.

The drain 42 of transistor M05 is connected to the output 40 of the voltage divider through a de-coupling means consisting of a transistor M03, also of the implanted or depletion type, having its source and gate connected to one another, to form a diode. An implanted capacitor CO4 is preferably connected between the drain of transistor M05 and ground.

The drain 41 of the transistor M06 is supplied by the voltage $V_{cc}$ through a depletion transistor M07, the gate of which is coupled to its drain to form a diode. Moreover, the drain 41 is coupled to the ground through a depletion transistor M09, having its gate coupled to the ground, again to form a diode. An implanted capacitor C08 is preferably connected in parallel to the transistor M09.

Finally, the first preferred embodiment of the power on reset circuit, comprises a branch consisting of a depletion transistor M10 and an enhancement transistor M11, series-arranged between the voltage M05 and the ground. The gate of the transistor M11 is driven by the drain 41 of transistor M06, while the gate of transistor M10 is driven by the drain 42 of the transistor M05. The junction point 44 of the two transistors M10, M11 forms the output of the power-on reset circuit of FIG. 1.

In the following disclosure, the junction points 42 and 41, the drains of the two transistors M09 and M08 of the bistable circuit, will also be called the true terminal and the negated terminal of the bistable circuit, respectively.

The bistable circuit remains in its state, as a conventional flip-flop circuit, since it has a high loop gain for all voltages greater than the enhancement threshold voltage $V_{Tenh}$, which is about 1 V.

As the power is switched on, i.e., as the voltage $V_{cc}$ rises starting from zero, the bistable circuit always comes up with function point 42 higher than function point 41. In fact, transistor M07, which is off at the start, has a low output, less than or at most equal to the level of $V_{cc}$ which is still low (since it is compelled to be low by a low $V_{cc}$) and which, moreover, is further reduced by the loss through the impedance of M09. The low voltage at the junction point 41 controls the gate of the transistor M05 to keep it in an off state. Therefore, the voltage at the junction point 42 is allowed to raise, since there is no low impedance pulling it to ground.

Figure 2:
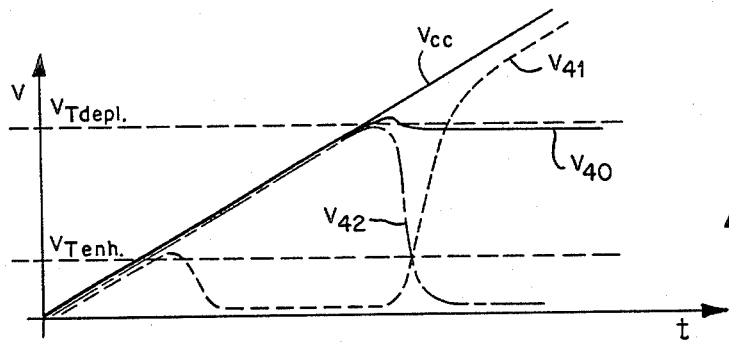
FIG. 2 is a qualitative diagram of a few crucial voltages in the circuit of FIG. 1 with respect to time.

With reference to the diagram of FIG. 2, when the supply voltage $V_{cc}$ ramp is applied to the voltage divider M01, M02, junction point 40 will rise to a value slightly less than the depletion threshold voltage $V_{Tdepl}$, and junction point 42, at the start, will follow it. Thus a strong additional current will be generated, which keeps transistor M06 on, thereby pulling to ground the junction point 41, until the switching threshold is reached.

Moreover, transistor M11 is off because its gate is coupled to junction point 41, which is low), while the gate transistor of M10 follows junction point 42. Therefore, the junction point 44, i.e., the output output of the circuit, also follows junction point 42 as shown in the diagram of FIG. 2, and supplies the positive initial portion of the reset pulse.

As the supply voltage $V_{cc}$ rises, it reaches a value greater than the voltage at junction point 40 the latter reaching a value slightly less than the depletion threshold voltage) and the current injected by $V_{cc}$ into the transistor M07 will bias junction point 41, thereby causing the bistable circuit to switch to the opposite state. Since the switching process is of a regenerative type, the voltage at junction point 44 will return to ground again, since junction point 42 is tied to ground by transistor M05 (since transistor M03 uncouples it from junction 40, while junction point 41 becomes high, since it is no more pulled by transistor M06 and is only weakly pulled by transistor M09 (the latter operates as a weak "sinker" or current drain).

Preferably the array is designed so as to have a triggering threshold of about 3.4 V, or less than 4 V, according to conventional methods of designing MOS circuits.

The capacitors C04 and C08 operate to smooth any noise that should interfere with the above disclosed operation.

Figure 3:
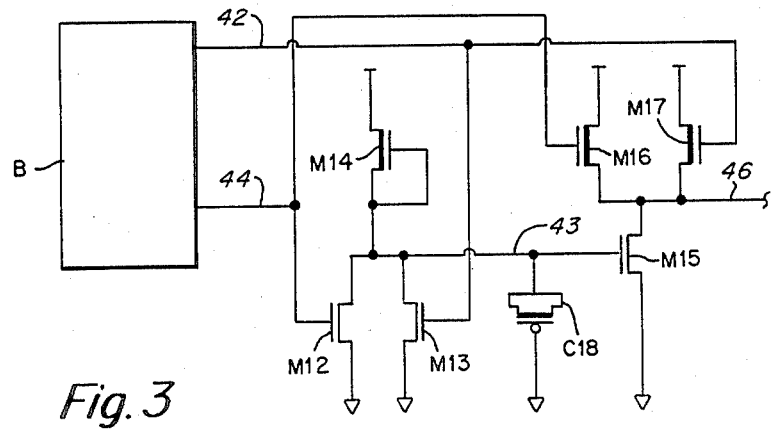
FIG. 3 is a circuit diagram of a second preferred embodiment of the invention.

With reference to FIG. 3, a second preferred embodiment will now be disclosed, for use when a high number of devices, for example more than 10 (a high "fan-out") are to be reset, for which the circuit of FIG. 1 would not be sufficient. The circuit according to the second embodiment substantially comprises the same circuit of FIG. 1, which is schematically represented by the block B, and further a NOR circuit consisting of two enhancement transistors M12, M13, having ground sources, and having their drains connected together in a junction point 43. The junction 43 is connected to the source of a depletion transistor M14 aacting as a load (or current source) leading to the supply voltage $V_{cc}$. The gates of transistors M12 and M13 are respectively coupled to junction point 44 and junction point 42 of block B. Moreover, junction point 43 is preferably connected to ground through a capacitor C18, this time not only for the reasons which have been indicated for the circuit of FIG. 1, but also for providing a time constant with transistor M14 as will become apparent below, as the charging of capacitor C18 through transistor M14 is considered.

Junction point 43 also drives the gate of an enhancement transistor M15 having its source connected to ground and the drain 46 connected in common to the sources of two depletion transistors M16, M17 and the gates of which are also respectively driven by junction points 44 and 42 of the block B of FIG. 1. The transistors M15, M16, M17 form together a push pull assembly, and its output, forming the reset signal, is junction point 46.

The NOR circuit comprising transistors M12, M13, M14 is driven by junction point 42, which also controls the transistor M10, and by the output 44 of the circuit of FIG. 1. Therefore, the junction point 43 inverts the output signal of the circuit of FIG. 1, but its rise will be delayed even after the same junction point 44 has been pulled to the ground, i.e. after the end of the initial reset pulse. The delay lasts the time necessary to charge, through the transistor M14, the capacitor C18 to a level at least equal to the threshold of the enhancement transistor M15. Therefore, the output signal on the junction point 46, in contrast to function point 44, will remain high for a rather long time, i.e. until junction point 43 reaches said enhancement threshold voltage level. The behavior of the voltage at junction point 46 of the circuit of FIG. 3 is shown in FIG. 4, for the case in which the capacitance is negligible; or in FIG. 5, wherein there is shown the extension or delay effect with respect to the pulse at junction point 44.

The circuitry added to the circuit of FIG. 1 operates as a buffer, with the twofold task of increasing the output power on junction point 46 and, if desired, of extending the duration of the reset signal (or reset pulse) with respect to that generated by the circuit of FIG. 1, by a suitable designing of the above mentioned time constant. If such an extension is not required, then the capacitor C18 may be dispensed with.

FIG. 5 shows an actual diagram of the voltages at the junction points 44 and 46 of a specific embodiment of the circuit of FIG. 3, in the assumption that a pulse-shaped supply voltage $V_{cc}$ is applied, having a duration of a few microseconds (which is unusually short).

While preferred embodiments of the invention have been disclosed, it is obvious that these embodiments are susceptible to many modifications and variations all of which come within the scope of the invention.

We claim:

1. A power-on reset circuit for MOS technology logic networks, for automatically supplying a reset voltage pulse as a supply voltgage is applied, particularly for peripheral units of microprocessors and the like, characterized in that it comprises:
   (a) a voltage divider having one and opposite ends and adapted for supplying a reference voltage and comprised of series arranged normally conducting transistors with one end coupled to a reference potential, the opposite end coupled to the supply voltage and defining therebetween a voltage divider coupling point;
   (b) a bistable circuit comprised of a decoupling means wherein said decoupling means is comprised of a normally conducting transistor, the gate of which is coupled to its drain and a third and fourth transistors, having their respective gates and drains cross-coupled, and their sources coupled to said reference potential, the drain of said third transistor being coupled to the voltage divider coupling point through said decoupling means and the drain of said fourth transistor being coupled to said supply voltage through a fifth transistor which is coupled as a diode; and
   (c) an end stage comprised of a sixth transistor which has its source coupled to said reference potential and its gate coupled to the drain of said fourth transistor, and a seventh transistor having its source coupled to the drain of said sixth transistor and its drain coupled to said supply voltage, the gate of said seventh transistor being coupled to the drain of said third transistor, the sixth and seventh transistors defining therebetween a coupling point forming the output line supplying said reset pulse.

2. A power-on reset circuit for logic networks according to claim 1, wherein the drain of said fourth transistor is coupled through an eighth transistor to said reference potential.

3. A power-on reset circuit for logic networks according to claim 2, characterized in that said first and second transistors are of the depletion type.

4. A power-on reset circuit for logic networks according to claim 3, characterized in that said third and fourth transistors are of the enhancement type.

5. A power-on reset circuit for logic networks according to claim 4, characterized in that said sixth transistor is of the enhancement type.

6. A power-on reset circuit for logic networks according to claim 5, characterized in that said seventh transistor is of the depletion type.

7. A power-on reset circuit for logic networks according to claim 6, characterized in that between the reference potential and the drains of the third and fourth transistor, related capacitors are coupled.

8. A power-on reset circuit for logic networks according to claim 1, characterized in that it further comprises:
   (a) a NOR circuit having two inputs respectively controlled by said output terminal or line of said end stage and the drain of said third transistor;
   (b) a push-pull circuit driven by the output of said NOR circuit.

9. A power-on reset circuit for logic networks according to claim 8, characterized in that said NOR circuit comprises two normally non-conducting transistors having the sources coupled to the reference potential and the gates forming said inputs of the NOR circuit, and a normally conducting transistor coupled between the supply voltage and drains of said two transistors, and also having its gate coupled to said drains.

10. A power-on reset circuit for logic networks according to claim 9, characterized in that between the drains of said two normally non-conducting transistors of said NOR circuit and the ground there is coupled a capacitor adapted for controlling the time constant and extending the duration of the reset pulse.

11. A power-on reset circuit for logic networks according to claim 10, said circuit being built in, in an integrated circuit.

12. A power-on reset circuit for providing a reset pulse comprising;
   (a) a reference voltage generator comprising a first and second normally conducting transistor, each having a source, a drain and a gate, the source of the first transistor being connected to the drain of the second transistor, the drain of the first transistor being connected to the supply voltage, and the source of the second transistor and the gates of both transistors being grounded;
   (b) a bistable circuit comprised of a decoupling means and third and fourth transistors having their respective gates and drains cross-coupled and their sources coupled to said reference potential, the drain of said third transistor being coupled to the voltage divider coupling point through said decoupling means and the drain of said fourth transistor being coupled to said supply voltage through a fifth transistor which is coupled as a diode; and
   and end stage comprised of a sixth transistor which has its source coupled to said reference potential and its gate coupled to the drain of said fourth transistor and a seventh transistor having its source coupled to the drain of said sixth transistor and its drain coupled to said supply voltage, the gate of said seventh transistor being coupled to the drain of said third transistor, the sixth and seventh transistors defining therebetween a coupling point forming the output line supplying said reset pulse.

13. A power-on reset circuit for MOS logic devices, adapted to generate a resetting voltage pulse on application of a supply voltage, comprising:
   (a) a reference voltage generator comprising a first (M01) and a second (M02) normally conducting transistors, each having a source, a drain and a gate, the source of the first transistor being connected to the drain of the second transistor, the drain of the first transistor being connected to the supply voltage, and the source of the second transistor and the gates of both transistors being grounded;
   (b) a bistable circuit comprising; a third (M05) and a fourth (M06) normally non-conducting transistors, each having a source, a drain and a gate, and each having its source connected to ground, the gates and drains of the third and fourth transistors being cross-connected; and diode means (M07) connected between the drain of said fourth transistor and the supply voltage;

(c) diode means (M03) connected between the drain of said third transistor and the source of said first transistor;

(d) a final stage comprising a fifth normally non-conducting transistor (M11) having a source connected to ground, a gate connected to the drain of the fourth transistor, and a drain; and a sixth transistor having a drain connected to the supply voltage, a source connected to the drain of the fifth transistor, and a gate connected to the drain of the third transistor;

(e) a NOR circuit having a first input terminal connected to the drain of said fifth transistor and a second input terminal connected to the drain of said third transistor, and an output terminal; and (f) a push-pull circuit driven by the output terminal of said NOR circuit.

14. The power-on reset circuit of claim 13, wherein said NOR circuit comprises a seventh and an eighth normally non-conducting transistors, each having a grounded source, a drain and a gate, diode means connected between the supply voltage and the drains of the seventh and eighth transistors, the gates of the seventh and eighth transistors being the first and the second input terminal of said NOR circuit.

15. The power-on reset circuit of claim 14, wherein said diode means is a normally conducting transistor having a source, a gate connected to the source, and a drain.

16. The power-on reset circuit of claim 14, wherein a capacitor is connected between the drains of said seventh and eighth transistors and ground.

17. The power-on reset circuit of claim 13, wherein a capacitor is connected between the drains of said third and fourth transistors and ground.

18. The power-on reset circuit of claim 13, incorporated in an integrated circuit.

* * * * *